United States Patent [19]
Nakahira et al.

[11] Patent Number: 5,938,871
[45] Date of Patent: Aug. 17, 1999

[54] METHOD AND APPARATUS FOR APPLICATION OF ADHESIVE

[75] Inventors: Hitoshi Nakahira; Hiroyuki Miyake, both of Yamanashi-ken; Osamu Ikeda, Nirasaki; Takashi Sasaki, Koufu; Yuzuru Inaba, Koufu; Toshiyuki Kinou, Koufu, all of Japan

[73] Assignee: Matsushita Electric Industrial Co., Ltd., Japan

[21] Appl. No.: 09/113,197

[22] Filed: Jul. 10, 1998

Related U.S. Application Data

[63] Continuation of application No. 08/685,604, Jul. 24, 1996.

[30] Foreign Application Priority Data

Jul. 24, 1995 [JP] Japan ................................. 7-186791
Nov. 20, 1995 [JP] Japan ................................. 7-301633

[51] Int. Cl.⁶ ............................. B32B 31/00; B05B 7/06; B05D 3/14
[52] U.S. Cl. ........................... 156/64; 156/356; 156/357; 156/378; 118/315; 118/323; 118/702; 427/8
[58] Field of Search ............................. 156/64, 356, 357, 156/378, 578; 118/313, 314, 315, 323, 697, 702, 712; 427/8, 9, 10

[56] References Cited

U.S. PATENT DOCUMENTS 3,715,258  2/1973  Cunnane ................... 156/356
4,010,203  3/1977  Aylon ....................... 156/578
4,170,883  10/1979 Varner ...................... 118/314
4,458,628  7/1984  Fujii et al. ............... 118/697
4,564,410  1/1986  Clitheros et al. ........ 156/356
4,872,417  10/1989 Kuwabara et al. ....... 118/313
5,110,615  5/1992  Maiorca et al. .......... 427/8
5,292,368  3/1994  Komine et al. .......... 118/315
5,336,357  8/1994  Layher et al. ........... 156/578
5,437,727  8/1995  Yoneda et al. ........... 156/356

FOREIGN PATENT DOCUMENTS

3064400   3/1988  Japan .
5-000262  1/1993  Japan .
5-293417  11/1993 Japan .

*Primary Examiner*—Mark A. Osele
*Assistant Examiner*—Sue A. Purvis
*Attorney, Agent, or Firm*—Parkhurst & Wendel, L.L.P.

[57] ABSTRACT

An application method of adhesive for applying an adhesive by an application nozzle on an application object. Each application object is positioned in a direction intersecting the conveying direction by the move of each tables and the individual application heads corresponding to the tables are individually moved and positioned in the conveying direction, and the adhesive is applied simultaneously to necessary positions of the application objects by the application heads, so that the production efficiency of electronic circuit boards is enhanced in various aspects without increasing the size of the apparatus.

2 Claims, 11 Drawing Sheets

(COMPONENT LIBRARY)     (DATA SETTING)

| SERECT APPLICATION NOZZLE | APPLICATION AMOUNT | HEAD RISE POSITION | HEAD RISE SPEED | HEAD FALL SPEED | APPLICATION COUNT | APPLICATION PITCH | APPLICATION DIRECTION |
|---|---|---|---|---|---|---|---|
| 9 | 9.9 | 9.99 | 4 | 4 | 9 | 9.9 | 0 |

PRODUCT LENGTH

| UPPER | LOWER | LEFT | RIGHT |
|---|---|---|---|
| 9.99 | 9.99 | 9.99 | 9.99 |

F1　F2　F3　F4　F5　F6 PREVIOUS PAGE　F7 NEXT PAGE　F8 END OF SETTING

METHOD AND APPARATUS FOR APPLICATION OF ADHESIVE

This is a Continuation of application Ser. No. 08/685,604 filed Jul. 24, 1996.

FIELD OF THE INVENTION

The present invention relates to a method and apparatus for application of adhesive for applying an adhesive on a necessary position of an application object, which is employed, for example, in application of an adhesive on mounting positions of electronic components in a circuit board, and affixing the electronic components to the mounting positions for manufacturing an electronic circuit board.

BACKGROUND OF THE INVENTION

Figure 10:
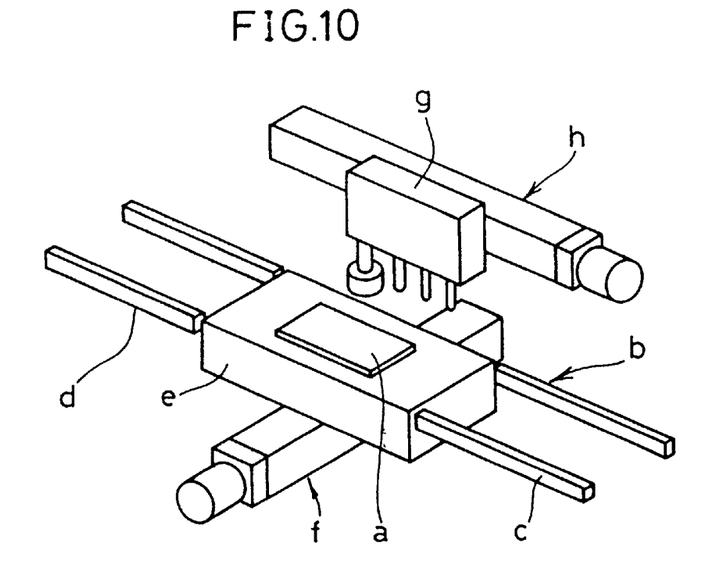
FIG. 10 is a schematic block diagram showing a conventional adhesive application apparatus.

This kind of apparatus for applying an adhesive on mounting positions of electronic components in a circuit board is structured as shown in FIG. 10.

This apparatus is disposed somewhere on a conveying route of a circuit board a, that is, between a loading portion c and an unloading portion d, and comprises:

a table e on which the conveyed circuit board a is set, being capable of moving in a direction at right angle to the conveying direction, table positioning means f for positioning the table e by moving in the direction at right angle to the conveying direction, an application head g disposed relatively to the table 3, being capable of applying an adhesive on necessary positions on the circuit board 1 and moving in the conveying direction, and head positioning means h for positioning the application head g by moving in the conveying direction.

The application positions of the adhesive on the circuit board 1 are scattered about on the horizontal plane of the circuit board a. In order to apply the adhesive on any position, it is necessary to move the table e and the application head g relatively in two directions of the X-axis direction and Y-axis direction mutually orthogonal on the horizontal plane.

In the apparatus shown in FIG. 10, the table e is movable in the direction at right angle to the conveying direction, while the application head g is movable in the conveying direction, thereby satisfying the above conditions. This constitution avoids a large structure allowing to four times of the area of the circuit board a as required in the constitution where only the table e moves in both X-axis direction and Y-axis direction, or only the application head g moves in both X-axis direction and Y-axis direction.

In such apparatus, however, the production efficiency of the electronic circuit board cannot be raised sufficiently, and it is impossible to meet the recent demand for higher speed in the manufacturing line of electronic circuit boards. More specifically, there is a limit in the moving speed of the table e and application head g, or the speed of application work in positioning state corresponding to the application positions.

To satisfy the requirements, by installing two application apparatuses in the conveying direction in the conveying route b, it has been already attempted to apply the adhesive on two circuit boards a simultaneously by using these application apparatuses.

In this constitution, however, the length of the conveying direction occupied by the application apparatuses on the manufacturing line of circuit boards a is twice as long as in the case of single apparatus, and it requires a wide plane space, and workers cannot cross the manufacturing line unless an overhead bridge or other bypass route is provided, and it is very inconvenient for maintenance control of parts of the manufacturing line, and maintenance, supply and other works of circuit boards a, adhesive, and parts required in the manufacturing line.

Figure 11:
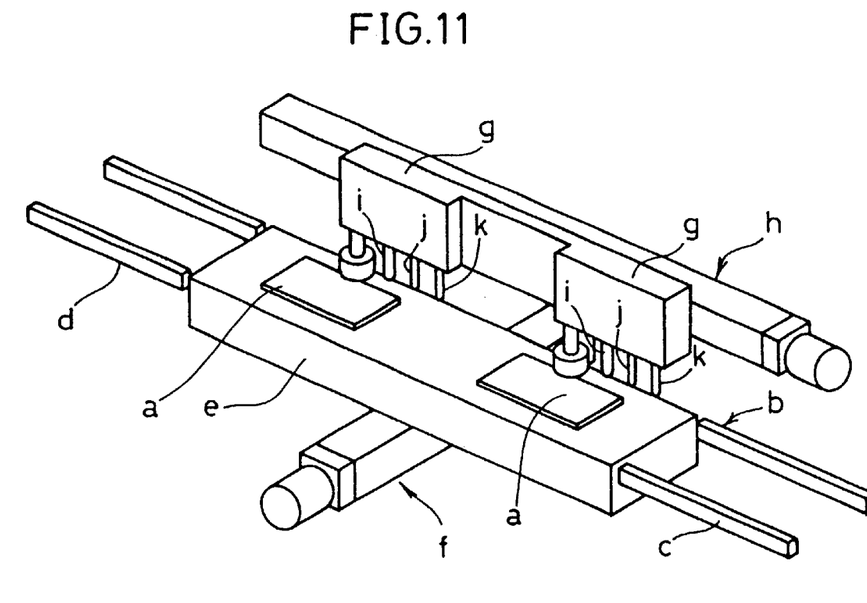
FIG. 11 is a schematic block diagram showing an improved example of the conventional apparatus.

Accordingly, in the midst of the conveying route b as shown in FIG. 11, a table e for setting two circuit boards a on is provided closely to the conveying direction, two application heads g are integrally coupled, and positioned above the table e so as to move and position, and the adhesive is applied simultaneously to both circuit boards a set on the table e by the application heads g.

By constituting as shown in FIG. 11, the length of the conveying direction occupied in the manufacturing line can be shortened as compared with the case of parallel installation of plural application apparatuses.

In the constitution in FIG. 11, however, two circuit boards a set on one table e cannot be freely positioned individually, and the application heads g are mutually coupled and cannot be moved individually, and hence it is hard to apply adhesive at high precision. In this case, the adhesive may be applied on the land of the circuit pattern formed on the circuit board a, and the electric connection of the mounted electronic component and the land may be defective, and the yield may be lowered.

Figure 1:
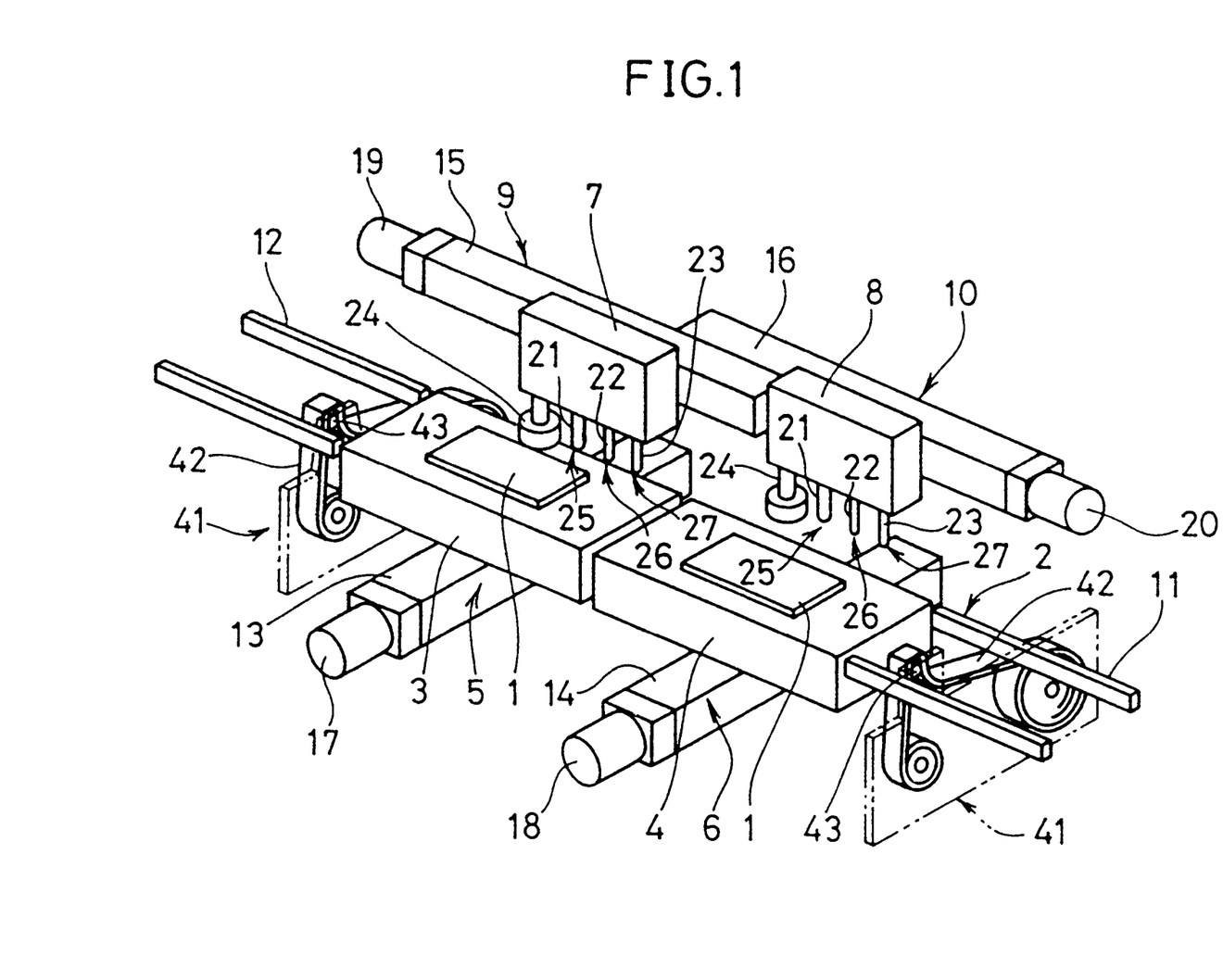
FIG. 1 is a perspective view showing a schematic constitution of an adhesive application apparatus in an embodiment of the invention.

In the conventional apparatus for applying adhesive shown in FIG. 10, incidentally, a trial application aid 41 for presenting a tape as a trial application by the application head g is provided near the table in the conveying route (see FIG. 1 which shows an embodiment of the invention).

This trial application aid 41 takes up a loaded roll tape 42 on a take-up reel 44 from above a backup material 43, and presents for trial application by the application head g while renewing the tape portion on the backup material 43.

By this trial application, the application head g prevents drying of adhesive at the nozzle tip while the applicator is not in use, and executes normal application of adhesive stably for a long period. The roll tape 42 is a consumable material, and when the roll tape 42 is used up, the application apparatus stops at the tape end, and the roll tape 42 must be replaced with a new one.

The conventional trial application aid 41 moves properly between the working position in which the backup material 43 is at same height as the conveying level of the circuit board a, and the escape position positioned lower than the conveying level of the circuit board a so as not to interfere the conveyance of circuit board a, and it is designed to realize trial application by the application head without disturbing the conveyance of the circuit board a.

DISCLOSURE OF THE INVENTION

However, if the trial application aid 41 moves only between the working position and escape position, the conveying mechanism of the circuit board 1 may disturb, and the replacing job efficiency of roll tape 42 is poor, and it takes a long time in replace work, and it affects the operation rate of the entire manufacturing line and the production efficiency of the electronic circuit boards cannot be raised.

Figure 12:
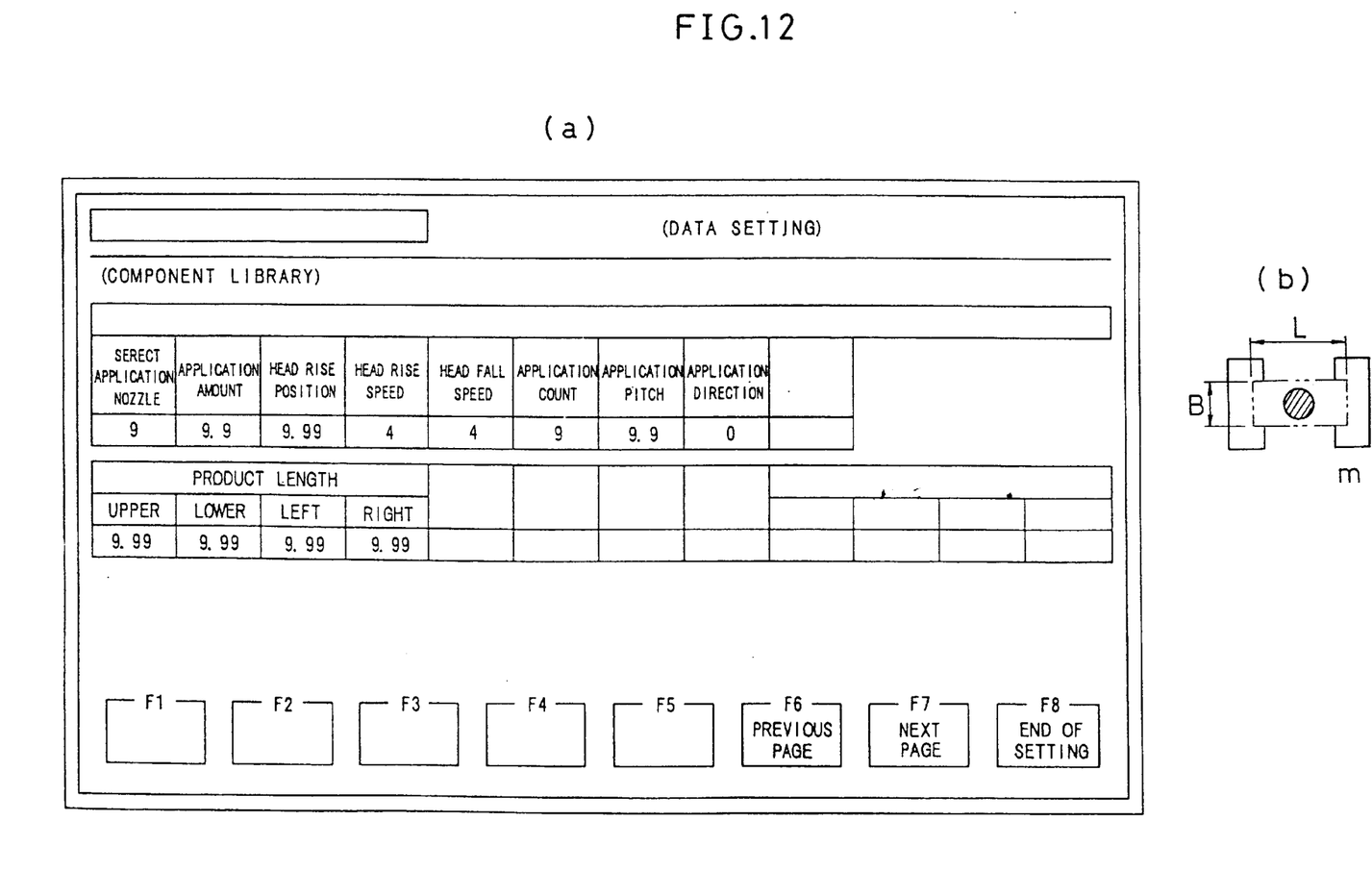
FIGS. 12(a) and 12(b) are explanatory diagrams of input screen for data setting in the conventional adhesive application apparatus.

Meanwhile, an optimum application diameter of adhesive is set depending on the type of the electronic components to be mounted, especially the size of the electronic components, and, hitherto, using a setting screen as shown in FIG. 12 (a), various application parameters of the adhesive are manually entered by the operator to set conditions in the application program, and the intended application job is effected. As for selection of application diameter, together with the length L and width B of the plane of the electronic component m to be mounted as shown in FIG. 12 (b), the nozzle of the corresponding application diameter is selected and set in every case.

Such job is complicated, and the operator must enter in the field, and it takes much time in data setting for production of electronic circuit boards, which is one of the causes of lowering the production efficiency of the electronic circuit boards.

The application head g incorporates three application nozzles i, j, k of large diameter L, small diameter S, and very small diameter VS as shown in FIG. 10. These application nozzles are selected and used depending on the setting corresponding to the difference in dimensions of the electronic components m mounted on application positions.

The application nozzles i, j, k are connected to individual adhesive tanks and work as individual applicators, and when the adhesive in the tank is used up, the application apparatus stops by detecting adhesive shortage. By replenishing the adhesive, the stopped application apparatus can resume application job. The adhesive replenishing timing of the application nozzles i, j, k varies with the consumption of adhesive per unit time depending on the frequency and amount of application.

If the adhesive replenishing timing in the adhesive tanks is not uniform, the application apparatus stops frequently, and the production efficiency of electronic circuit boards is largely lowered. Accordingly, if one application nozzle is used about twice as much as the other application nozzles, two application nozzles may be mounted on the application head g, and they are used alternately, so that the adhesive replenishing timing may match with other application nozzles, thereby preventing frequent stops of the application apparatus.

Now, in the constitution one application nozzle i of application diameter L and two application nozzles j of application diameter S, only by setting the application nozzle depending on the size of the electronic component according to the setting items on the setting screen as mentioned above, it is not determined which one of the two application nozzles j having same application diameter should be selected. For selecting and setting them, another application parameter is needed, and the program and setting operation will be more complicated, and hence the production efficiency of the electronic circuit boards is further lowered.

It is hence a primary object of the invention to solve such problems and present a method and apparatus for applying adhesive enhanced in the production efficiency of electronic circuit boards in various aspects without increasing the size of the apparatus.

According to an embodiment of the invention, conveyed application objects on plural tables disposed closely in the conveying direction of application objects, positioning each application object by moving each table in a direction intersecting the conveying direction and positioning individually individual application heads corresponding to each tables by moving the application heads in the conveying direction, and applying an adhesive to necessary positions of application objects by the application heads.

According to another embodiment of the invention which comprises plural tables disposed closely in the conveying direction of application objects, being capable of setting the conveyed application objects and moving individually in the direction intersecting the conveying direction, plural table positioning means for positioning these tables by moving in a direction intersecting the conveying direction, plural application heads disposed corresponding to the tables, being capable of applying the adhesive to the application objects set on the tables and moving individually in the conveying direction, and plural head positioning means for moving the application heads by moving in the conveying direction.

According to an aspect of the invention using the plural tables closely disposed in the conveying direction of the application objects and plural application heads disposed corresponding thereto, since the plural tables position the set application objects by moving in the direction at a right angle to the conveying direction, the plural tables do not require the conveying direction length more than they are disposed closely in the conveying route, and the application heads have the conveying direction length nearly the same as the tables, and although they move in the conveying direction for positioning purpose, they only superpose partly with the region for loading and unloading the application objects, not requiring more than the conveying direction length necessary for disposing the tables, so that the apparatus is not increased in size. Moreover, the tables individually move in the direction at a right angle to the conveying direction, and individually position the application objects on the tables, and the application heads move individually in the conveying direction to be positioned individually, and therefore the application heads corresponding to any position of the application objects can be positioned accurately, the adhesive is applied parallel to plural application objects, and sufficient application precision is assured, so that the working efficiency is enhanced. Therefore, the request for high speed operation in the production line of electronic circuit boards can be satisfied sufficiently without increasing the size of the apparatus.

According to a another embodiment of the invention which comprises tables capable of setting the conveyed application object, application heads disposed corresponding to the tables and capable of applying adhesive to the application objects set on the tables, positioning means for relatively moving the tables and application heads and positioning the application heads to confront the necessary positions of the application objects set on the tables or necessary positions near the application objects, a trial application aid provided at a specific close position to the tables for sequentially letting out a roll tape to be used in trial applications by the application heads, a support mechanism for supporting the trial application aid so as to be movable to a waiting position lower than the application object conveying level of the conveying route, working position of a same height as the application object conveying level, and a tape replace position higher than the application object conveying level, and a driving means for moving the trial application aid at least between the waiting position and working position.

According to this constitution, by the relative move of the conveyed application object in the conveying direction of the tables and the application heads and in the direction at a right angle thereto, the adhesive can be applied to any position of the application objects.

Moreover, clogging in the nozzle while not in use can be prevented by trial applications on the roll tape mounted on the trial application aid elevated to the application object conveying level, and in particular the trial application aid is moved properly by a driving means between the working position and the waiting position lower than the application object conveying level as described above, and therefore while automatically using in trial applications at such timing as not disturbing the conveyance of application objects, the trial application aid can be moved above the application object conveying level, and therefore the roll tape can be replaced easily in a short time without disturbing the conveying mechanism of application objects or the like, so that the job efficiency may be enhanced.

According to another embodiment of the invention which comprise applying adhesive to necessary positions of application objects by application heads capable of selecting plural application diameters according to a preset program, obtaining information on dimensions of components to be mounted on application positions from a program, determining the application diameter according to the information on dimensions, and applying the adhesive in the application diameter required on each occasion.

According to another embodiment of the invention which comprises tables capable of setting a conveyed application object, application heads disposed corresponding to the tables and capable of selecting plural application diameters for applying adhesive on necessary positions of the application objects on the tables, positioning means for relatively moving the table and application heads, and positioning the application heads to confront the necessary positions of the application objects on the table, memory means for storing an operation program including positions on the application objects to be applied with the adhesive, the number of positions to be coated with the adhesive, an elevating speed of the application heads, and dimensions of components to be mounted on the application positions, a first control means for operating and controlling the positioning means and application heads so as to apply the adhesive sequentially to necessary positions of the application objects according to the operation program stored in the memory means, and a second control means for controlling the application diameter when applying the adhesive to each position by the application heads according to the information on dimensions of components corresponding to the application positions in the operation program stored in the memory means.

According to another aspect of the invention each application head has plural applicators differing in application diameter, and the second control means selects applicators to be used in application on the basis of the dimensions of components to be mounted on each mounting positions read out from the operation program.

According to another aspect of the invention the adhesive is applied to the application objects by the application heads automatically according to the operation program, at the same time, the adhesive is applied in an application diameter automatically selecting from the plural application diameters of the adhesive possessed by the application head on the basis of the information on the dimensions of the components corresponding to the application positions in the operation program. Therefore, any particular setting operation for selecting the application diameter is not needed, and the job efficiency for setting new application conditions for the application object is enhanced.

According to an embodiment of the invention which comprises applying automatically the adhesive to the application objects by selecting an applicator/applicators to be used out of plural applicators according to an operation program, using plural applicators of a same application diameter, obtaining the total number of times of using the plural applicators having a same application diameter in a specific unit from the information in the operation program about positions to be applied with the adhesive in the application objects, the number of times of application of the adhesive at each position, and application diameter determined for a component to be mounted at each position, dividing the total number of times of use by the number of applicators having a same diameter, and sequentially changing over the plural applicators in use having a same application diameter every time the divided number of times of applications is reached.

According to another embodiment of the invention which comprises tables capable of setting a conveyed application object, application heads disposed corresponding to the tables and capable of applying adhesive to the application objects by selecting from plural application diameters, positioning means for relatively moving the tables and application heads so that the application head may confront a necessary positions of the application objects, a memory means for storing an operation program for applying the adhesive sequentially to necessary positions of the application objects, a first control means for applying the adhesive according to the operation program stored in the memory means, an operating means for obtaining the total number of times of using plural applicators having a same application diameter in a specific unit, on the basis of the information set in the operation program including application positions of the adhesive in the application objects, the number of times of application of the adhesive in each position, and the application diameter determined according to the type of the component to be mounted on each position, and dividing the number of times of use by the number of applicators having a same diameter, and a second control means for sequentially changing over the plural applicators in use having a same diameter each time the divided number of times of application is reached.

Another aspect of the invention comprises applying the adhesive to the application object automatically according to an operation program by using plural applicators having a same application diameter, from the information in the operation program about the application positions of the adhesive in the application objects, the number of times of application of the adhesive at each position, and the application diameter determined in consideration of the component mounted on each position, the total number of times of use of the plural applicators having a same application diameter in a specific unit, for example, the total number of times of use of one or plural number of application objects is obtained, and this total number of times of use is divided by the number of applicators having a same diameter, and the plural applicators having a same diameter are sequentially changed over for use each time the divided number of times of application is reached, and therefore the plural applicators having a same diameter are used uniformly in a specific unit range, and this relation is not broken irrespective of how many times the specific unit is repeated, and the replenishing timing for each adhesive is about the same, including others, and hence lowering of working efficiency due to non-uniform replenishing timing of applicators can be avoided without any particular setting or operation for using the plural applicators having a same diameter, so that drop of job efficiency due to extra time taken by a particular setting operation may be prevented.

According to another embodiment of the invention which comprises checking preliminarily that the application shape of every kind of adhesive to be applied by the applying apparatus is stabilized on and after the n-th time trial application specific to each adhesive, and registering the n-th time for each adhesive in a control unit; performing trial applications continuously with every kind of adhesive to be applied by the applying apparatus at the time of starting actual operation or changing the adhesive to be used, and confirming the application shape of the n-th time trial application with the adhesive by a recognition means; comparing the result of recognition by the recognition means with the shape of the n-th time trial application specified and registered in the control unit; and starting actual production when the result of recognition is approved to be satisfactory.

According to an embodiment of the invention, if multiple types of adhesive differing in viscosity or other properties are used, the application diameter and application area of the trial application to be recognized, and the application diameter and application area in an actual production may always be matched, and the discharge capacity of the application nozzle can be set easily in a short time, and uneven discharge in an actual production can be eliminated.

DESCRIPTION OF THE PREFERRED EMBODIMENTS

Embodiments of the method and apparatus for application of adhesive of the invention are described below while referring to FIG. 1 to FIG. 9.

The adhesive application apparatus of the embodiment is used in manufacture of electronic circuit boards by mounting electronic components on a circuit board, and its schematic constitution is shown in FIG. 1. In this application apparatus, as shown in FIG. 1, plural tables 3 and 4 for setting circuit boards being conveyed are disposed in a conveying route 2 of circuit boards 1 as application objects, closely in the conveying direction as indicated by arrow, and the tables 3 and 4 can be moved individually in the direction intersecting the conveying direction, that is, in the direction at right angle to the conveying direction.

Table positioning means 5 and 6 move the tables 3 and 4 in the direction at right angle to the conveying direction, and position individually.

Application heads 7 and 8 are disposed corresponding to the tables 3 and 4, and apply adhesive to necessary positions of the circuit boards 1 on the corresponding tables 3 and 4. The application heads 7 and 8 can be moved individually in the conveying direction.

Head positioning means 9 and 10 move these application heads 7 and 8 in the conveying direction, and position individually.

Incidentally, the application objects are not limited to circuit boards 1, but the invention may be applied in any other objects that require application of adhesive.

In the embodiment using such apparatus, conveyed circuit boards 1 are received and set on the plural tables 3 and 4 disposed closely in the conveying direction of the circuit boards 1, the circuit boards 1 are positioned individually by moving in the direction at right angle to the conveying direction by the table positioning means 5 and 6 of the tables 3 and 4, and the individual application heads 7 and 8 corresponding to the tables 3 and 4 are individually positioned by moving in the conveying direction by the head positioning means 9 and 10, and the adhesive is individually applied to necessary positions on the circuit boards 1 on the tables 3 and 4 positioned by these positioned application heads 7 and 8.

In this way, using the plural tables 3 and 4 disposed closely in the conveying direction in the midst of the conveying route 2 of the circuit boards 1, and the plural application heads 7 and 8 disposed corresponding thereto, the plural tables 3 and 4 move in the direction at right angle to the conveying direction, and position the set circuit boards 1, and therefore the plural tables 3 and 4 do not require the length in the conveying direction more than they are disposed closely in the conveying route 2.

The application heads 7 and 8 have nearly same conveying direction length as the tables 3 and 4, and move in the conveying direction for positioning, but they superpose only in part with the region for loading unit 11 and unloading unit 12 of circuit boards 1, and do not require the length in the conveying direction more than required for disposing the tables 3 and 4, and hence the application apparatus is not increased in size.

Moreover, since the tables 3, 4 and application heads 7, 8 position individually by independent move not affecting each other, the corresponding application heads 7, 8 can be accurately positioned to any position of the circuit boards 1 on the tables 3, 4 positioned individually by moving in the direction at right angle to the conveying direction, and therefore the adhesive may be applied parallel to plural circuit boards 1 at accurate application precision, so that the job efficiency may be enhanced.

It is hence possible to satisfy the request for high speed operation in the circuit board production line sufficiently without increasing the apparatus size.

Although not shown in the drawing, the tables 3, 4 have the mechanism for receiving and setting the circuit boards 1 from the loading unit 11 to specified positions, holding in position, and sending out to the unloading unit 12 after the step of application of adhesive, but it is same as known hitherto and specific description is omitted.

Similarly, the table positioning means 5, 6 and head positioning means 9, 10 comprise servo motors 17 to 20 provided at one end of guide rails 13 to 16 for guiding the tables 3, 4 and application heads 7, 8, and rotate and drive screw shafts, not shown, on the basis of the detection position information from position detecting means such as encoder, not shown, interlocked with the screw shaft, thereby positioning in specified positions. Such mechanism is also known hitherto and specific description is omitted.

Also, the application heads 7, 8 of the embodiment respectively have plural application nozzles 21, 22, 23 and recognition camera 24. The application nozzles 21 to 23 are connected to individual tanks, not shown, and form individual applicators 25 to 27, and the application apparatus stops operation when the adhesive in the tank is used up by detecting adhesive shortage, so as to replenish with adhesive. This is also known well hitherto and specific description is omitted.

The recognition camera is used for recognizing the surface state of circuit board 1, roll tape 42, and others, and adjusting the application conditions automatically. The number of application nozzles used in the application heads 7, 8 may be one, two, three or more, which should be determined depending on necessity. The plural application nozzles 21 to 23, etc., are basically different in application diameter. However, in the case of the application diameter of which frequency of use is integer times more than in others, by preparing in the number of such integer times and using uniformly, the adhesive replenishing timing is nearly matched with others, and the problems of frequent stops of the application apparatus due to uneven replenishing timing may be avoided. In the application apparatus of the embodiment, the application nozzle 21 provided in the application heads 7, 8 has large diameter L, and the application nozzles 22, 23 have small diameter S.

Figure 4:
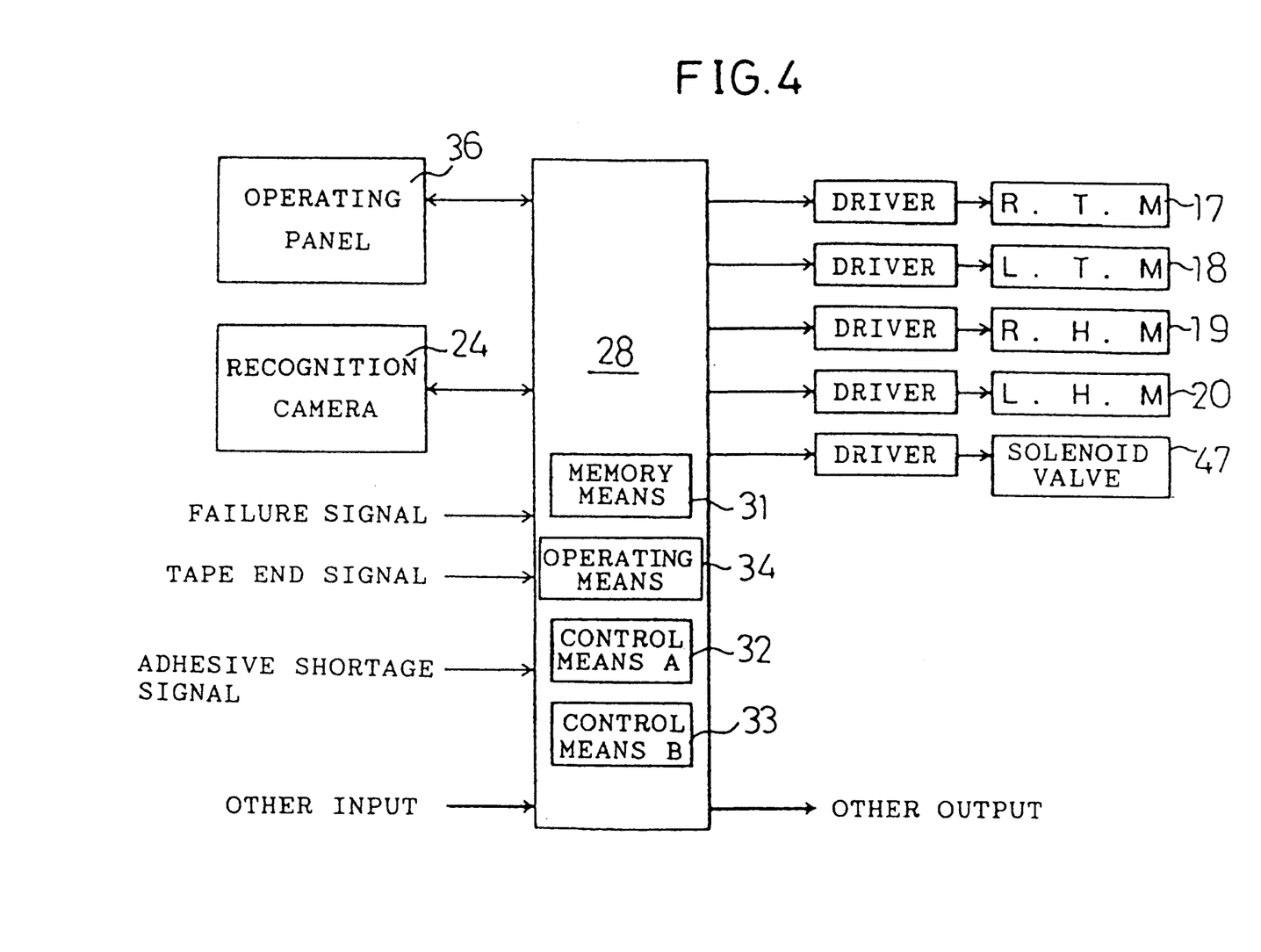
FIG. 4 is a block diagram of a control circuit in the same embodiment.

Thus, application of adhesive to necessary positions on the circuit board 1 by the application heads 21 to 23 capable of selecting from plural application diameters is done automatically according to a specific operation program. Accordingly, in the apparatus of the embodiment, the control device using a microcomputer 28 as shown in FIG. 4 is used. Of course, any control device of other system may be similarly employed.

The microcomputer 28 has internal memory means 31, which stores an operation program including adhesive application positions on the circuit board 1, number of times of application of adhesive at each position, elevating speed of application heads 7, 8, and dimensions of components to be mounted on the application positions by making use of the adhesive applied at each position. Such program and data are set by input operation from an operation panel 36 into the internal memory means 31, or by connection of various external memory means, such as flexible sheet, compact disc, and other control device. Other more appropriate techniques may be also employed.

The recognition camera 24 is also connected to the microcomputer 28, and various failure signals, adhesive shortage in the applicators 25 to 27, tape end signal in the trial application aid 41 as shown in FIG. 1 used for trial application, and other signals are entered. Input of these failure signals, adhesive shortage signals, and tape end signals is handled as stop signal of the application apparatus.

Figure 3A:
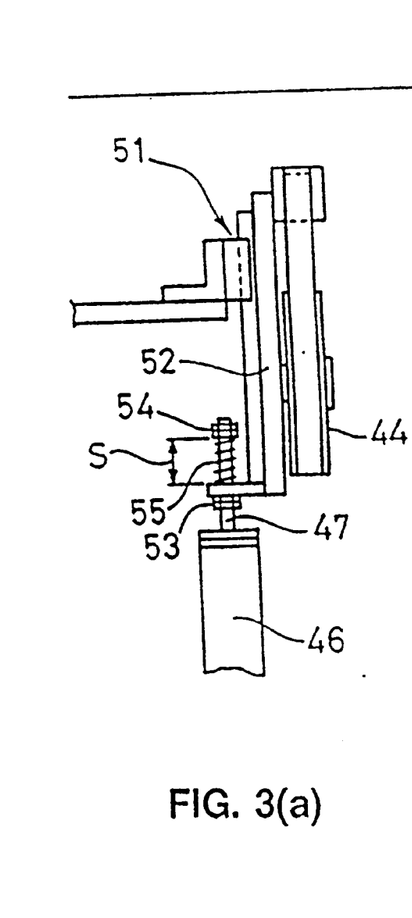
FIG. 3(a)–3(c) are an explanatory diagram showing support structure and operation state of the trial application aid in the same embodiment.
Figure 3B:
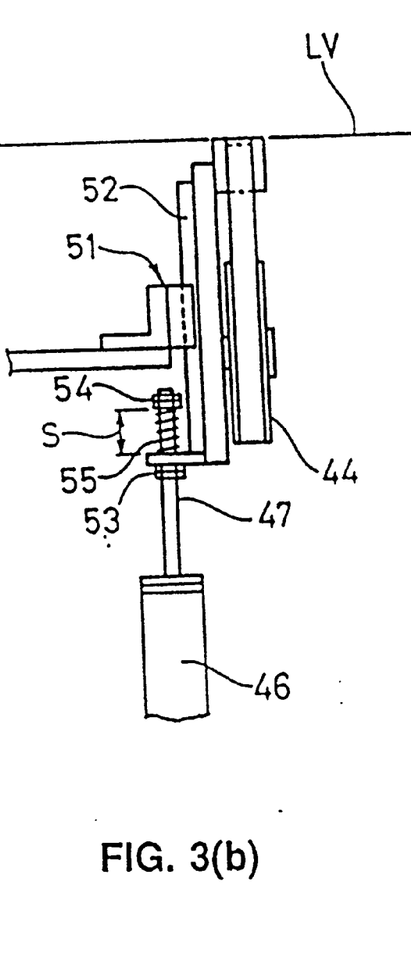
Figure 3C:
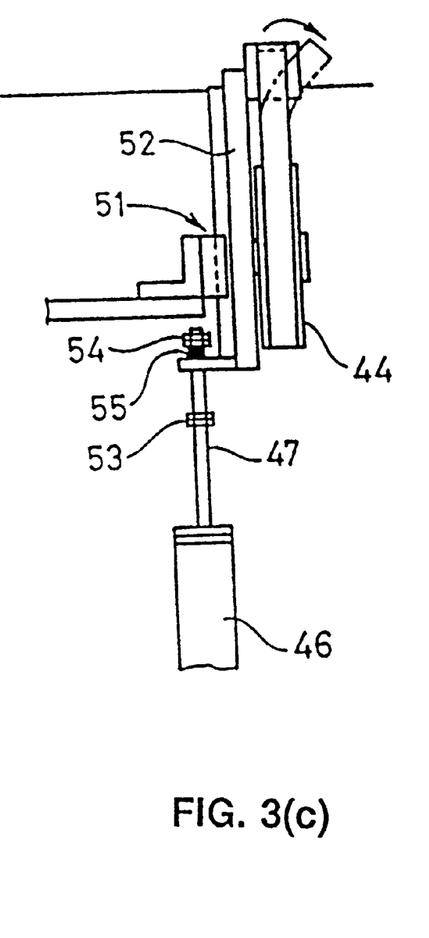

The microcomputer 28 controls the servo motors 17 to 20 of the t able positioning means 5, 6 and head positioning means 9, 10 by A control means 32 as first control means for the above controls, and also controls a solenoid valve 47 for controlling expansion and contraction of an air cylinder 46, as shown in FIGS. 3(a)–3(c) which are example of drive means of trial application aid 41.

The microcomputer 28 also controls the operation of the mechanism for raising and lowering the application nozzles 21 to 23 for applying the adhesive by specified application nozzles 21 to 23 provided in the positioned application heads 7, 8. This is achieved by controlling the solenoid valve by using air cylinder, and it is already known and is not explained herein.

The application heads 7, 8 are also positioned on every occasion to the position confronting the trial application aid 41 for trial application, and performs trial application on the roll tape 42 mounted thereon. Take-up of the roll tape 42 is operated and controlled by the microcomputer 28 by installing an exclusive motor. By making use of the operation of trial application by the application heads 7, 8, a mechanism for letting out a specific amount on every occasion of trial application may be also employed.

Figure 2A:
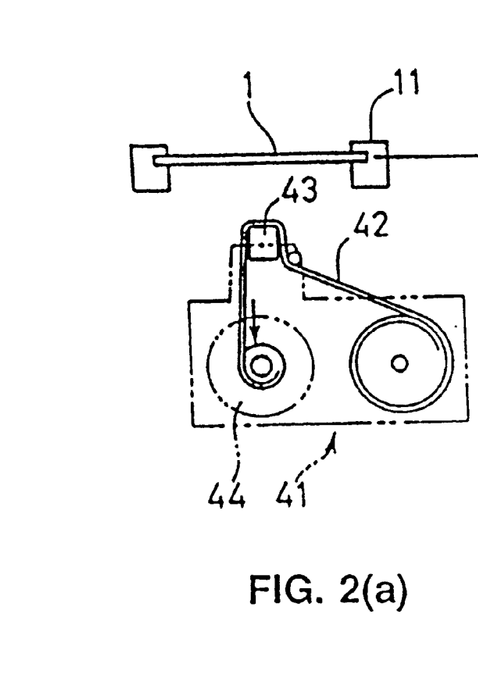
FIGS. 2(a)–2(c) are an explanatory diagram showing an operation state of a trial application aid in the same embodiment.
Figure 2B:
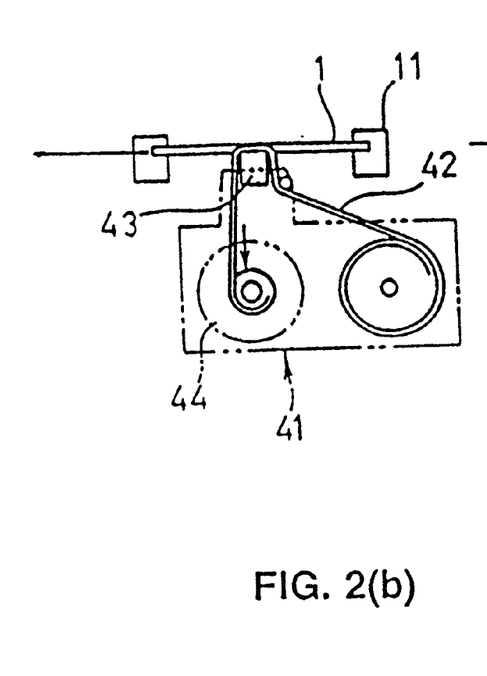
Figure 2C:
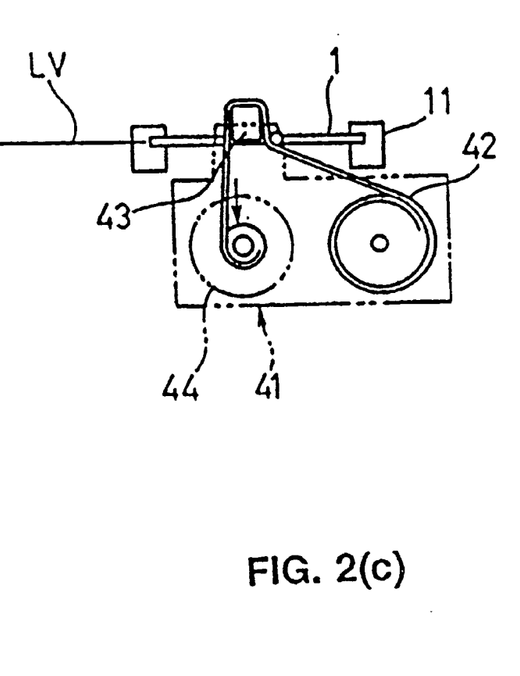

The trial application aid 41 is supported and guided so as to move between the waiting position lower than the conveying level LV of the circuit boards 1 shown in FIG. 2 (a), FIG. 3 (a), and the replace position projected higher than the conveying level LV of the circuit boards 1 shown in FIG. 2 (c), FIG. 3 (c), by a proper guide mechanism 51. Various known structures may be employed for this guide mechanism 51.

In the trial application aid 41, a cylinder rod 47 of the air cylinder 46 is coupled to a substrate 52, and it is designed to move up and down between the waiting position and the working position at the same height as the conveying level LV of circuit boards 1 shown in FIG. 2 (b), FIG. 3 (b). For coupling between the cylinder rod 47 and substrate 52, a play S is provided between lower positioning nut 53 and upper positioning nut 54 provided at upper and lower positions of the leading end of the cylinder rod 47, and a spring 55 is used between the upper positioning nut 53 and substrate 52, and the substrate 42 is usually moved up and down between the waiting position and working position along with expansion and contraction of the air cylinder 46 in a state being positioned to the position of the lower positioning nut 52, but when pulled upward by holding a handle, not shown, provided in the substrate 52 or hooking hand in a proper position of the trial application aid 41, it is designed to pull up the trial application aid 41 to the replace position while compressing the spring 55 by making use of the play S. Incidentally, as the driving means instead of the air cylinder 46, motor or other actuator may be used, and moving to the replace position may be done automatically by such driving means. In this case, together with the control for stopping the application apparatus by tape end signal, the trial application aid 41 may be controlled to be raised to the replace position.

The trial application aid 41 is properly moved between such working position and the waiting position lower than the conveying level LV of the circuit boards 1, and it is used automatically in trial application at the timing not interfering conveyance of circuit boards 1, and the trial application aid 41 is moved above the conveying level LV of circuit boards 1, so that the roll tape 42 may be replaced easily and in a short time without interference by the conveying mechanism of circuit boards 1 or the like, so that the job efficiency is enhanced.

When replacing the roll tape 42 while it is still hooked on the backup material 43 as shown in FIG. 2 (c) and FIG. 3 (c), as indicated by virtual line in FIG. 3 (c), the roll tape 42 can be easily detached by shifting sideways from the backup material 43 by finger, so that the roll tape 42 may be replaced easily.

Therefore, the invention sufficiently satisfies the requirement for high speed operation in the production line of electronic circuit boards without increasing the size of apparatus. Such feature may be similarly exhibited in other apparatuses than conventional apparatuses not employing the positioning system and application system of the embodiment as shown in FIG. 1, and the constitution combined with them also belongs to the scope of the invention.

In the embodiment, application nozzles 21, 22, 23 of different application diameters mounted on application heads 7, 8 are selectively used, by obtaining the dimension information of the components mounted on the application positions by using the applied adhesive by B control means 33 as second control means from the program stored in the memory means 31, determining the application diameter from the dimension information, and setting data in the program so that the adhesive may be applied in the required application diameter on every occasion.

Thus, by the dimension information of the components corresponding to the application positions in the program, the plural application diameters of adhesive of the application heads 7, 8 are selected automatically and the adhesive is applied, so that particular setting operation for selecting the application diameter is not needed, and the working efficiency for setting new application conditions for application objects may be enhanced.

It is therefore enough to satisfy the requirement for high speed operation in the production line of circuit boards without increasing the size of the apparatus. Such feature may be similarly exhibited in other apparatuses than conventional apparatuses not employing the positioning system and application system of the embodiment as shown in FIG. 1, and the constitution combined with them also belongs to the scope of the invention. Plural application diameters are obtained also by application diameter adjustment by one applicator. In this case, only one application is enough, and selection of application diameters is replaced by adjustment of application diameter by one applicator, and they are essentially the same.

Also in this embodiment, instead of the plural applicators 22, 23 of same application diameter, the B control means 33 obtains the total number of times of use necessary in the plural applicators 26, 27 having same application diameter in specific unit from the information of the program about the application positions of adhesive on the circuit boards 1, number of times of application of adhesive on each position, and the application diameter determined corresponding to the electronic components to be mounted on each position, and divides the total number of times of use by the number of applicators 26, 27 of same diameter, for example, by utilizing operating means as internal function of microcomputer 28, and the data is set in the program so as to changeover sequentially and use the plural applicators 26, 27 having same diameter every time reaching the divided number of applications.

In this way, the number of times of use of plural applicators 26, 27 having same diameter is equal in a range of various specific units, such as the number of applications by the same application diameter of one or plural number of circuit boards 1, or the number of application times divided into a specific number from the number of times of application by the same application diameter in one circuit board 1, and this relation is not broken if application jobs are done by repeating the specific unit how many times, and each adhesive replenishing timing is almost same including others, and it is hence effective to avoid lowering of the job efficiency due to different adhesive replenishing timings in the applicators 25 to 27, without any particular setting operation for selecting plural applicators 25 to 27 with same application diameter, and it is also effective to prevent lowering of job efficiency due to extra time for particular setting operation.

These embodiments are therefore enough to satisfy the requirement for high speed operation in the production line of circuit boards without increasing the size of the apparatus. Such feature may be similarly exhibited in other apparatuses than conventional apparatuses not employing the positioning system and application system of the embodiment as shown in FIG. 1, and the constitution combined with them also belongs to the scope of the invention.

Figure 5:
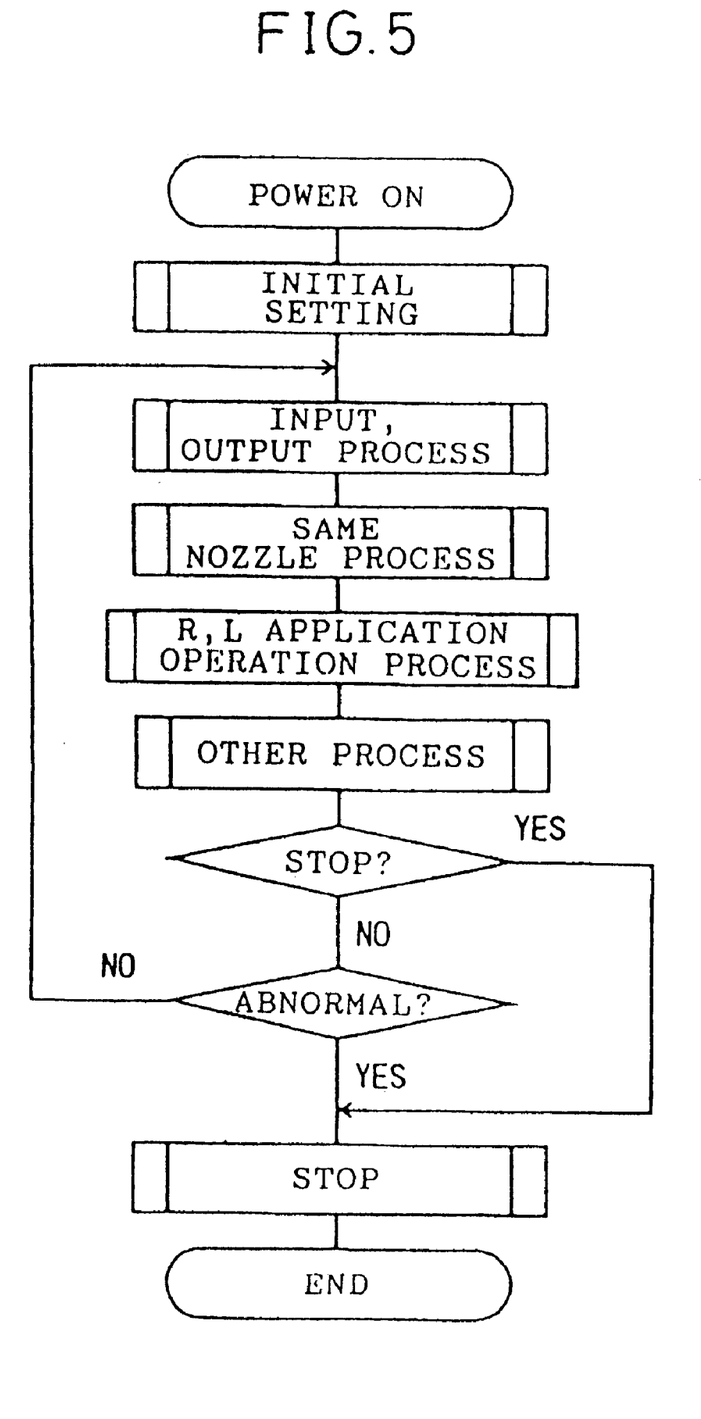
FIG. 5 is a flow chart of main routine of the control circuit in the same embodiment.
Figure 6:
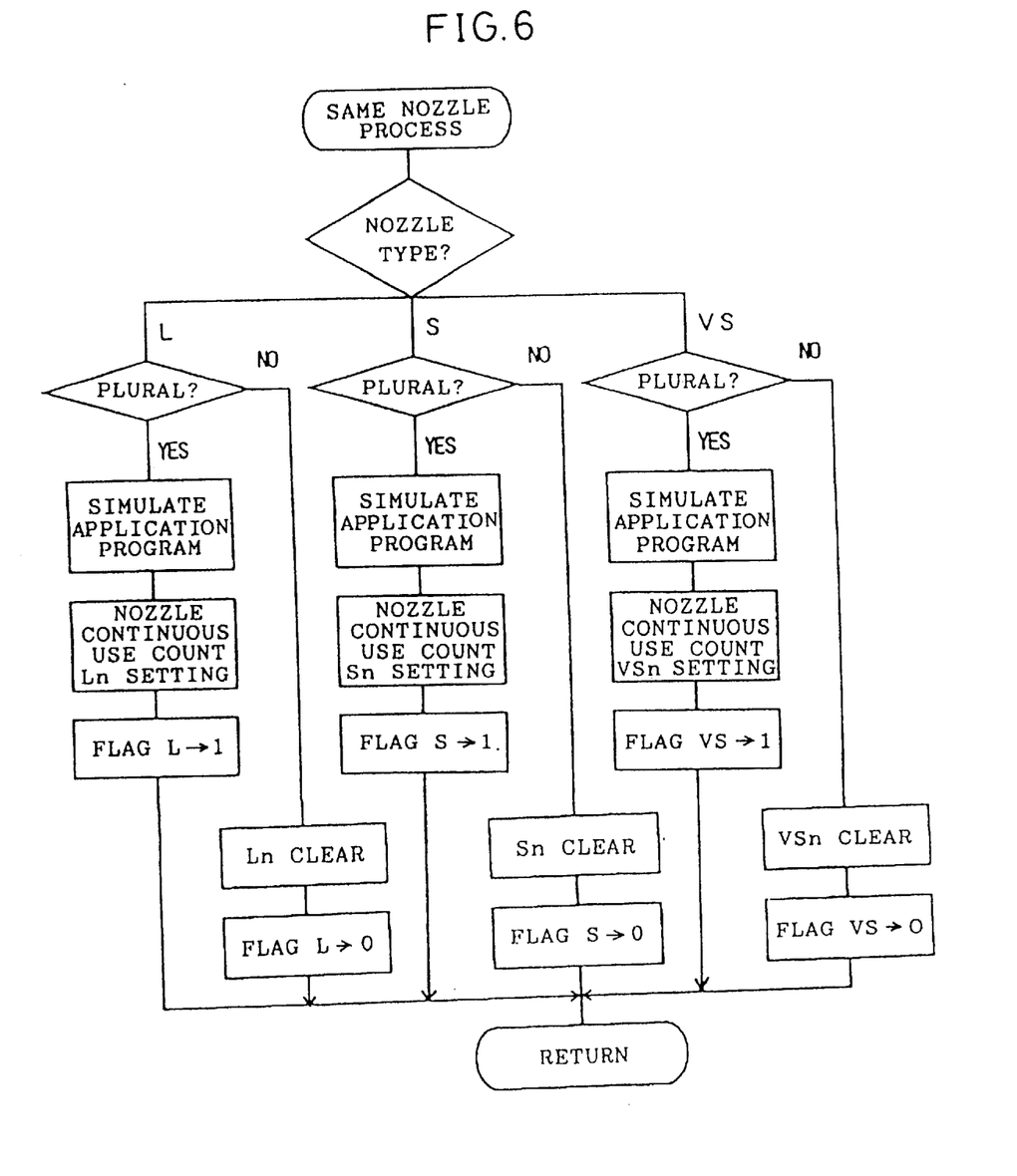
FIG. 6 is a flow chart of sub-routine of same nozzle processing.
Figure 7:
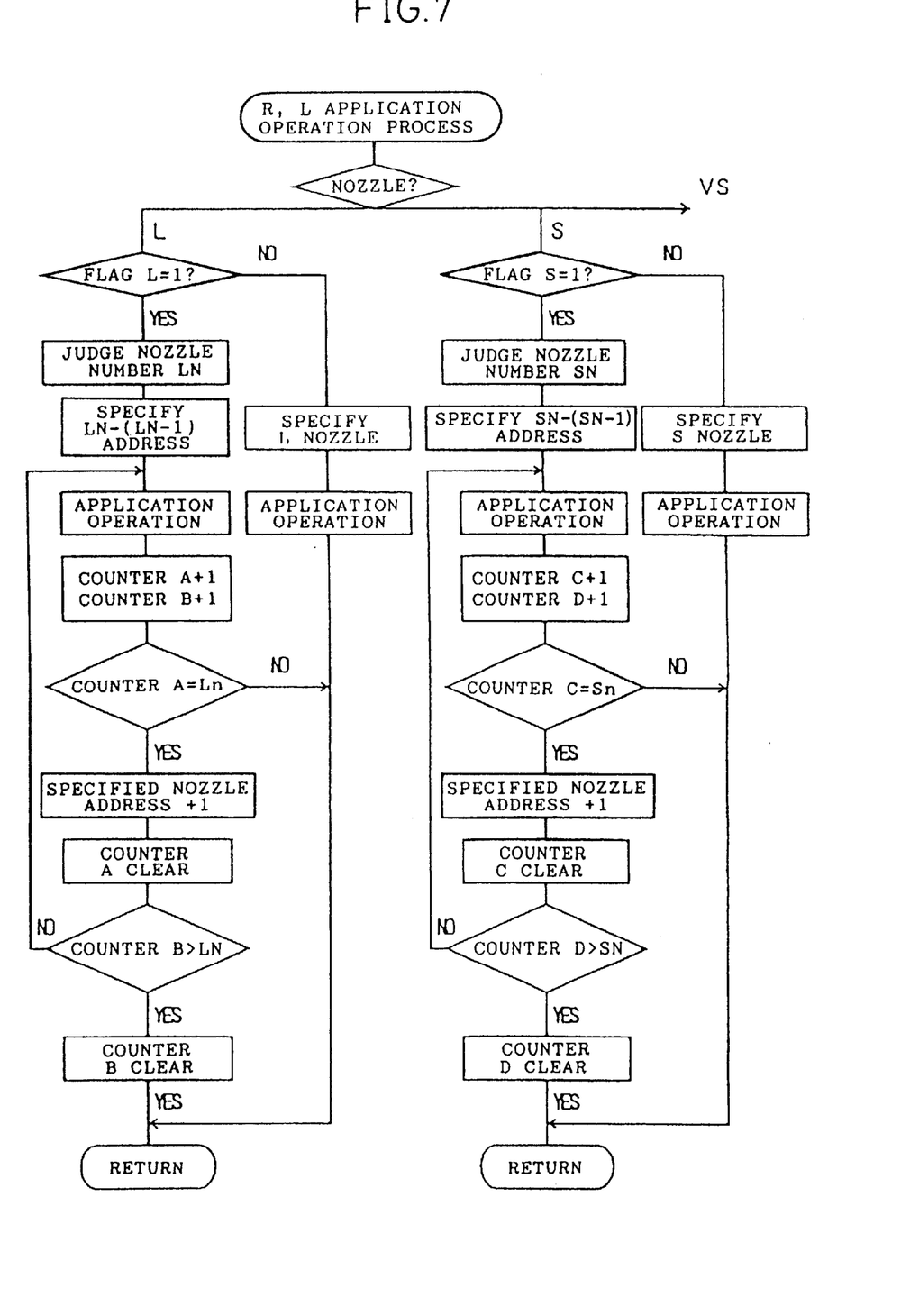
FIG. 7 is a flow chart of sub-routine of R, L application operation processing.

FIG. 5 to FIG. 7 are flowcharts showing practical examples of each operation control using the microcomputer 28.

FIG. 5 relates to the main routine showing the principal operation control, in which various initial settings are done by turning on the power source. Consequently, after various input and output processes, if it is the mode of plural application nozzles having same application diameter on the basis of various data setting by the input and output processes, same nozzle processing is done for data setting for using uniformly as mentioned above. In succession, according to the set application conditions, application is effected by the application heads 7, 8. Next, after operation control of the trial application aid 41 and other necessary controls, and operation is stopped in the presence of stop signal or failure signal, or the control after input and output processes is repeated in the absence of these signals.

FIG. 6 is a practical example of sub-routine of same nozzle processing. This is processed only on plural application nozzles having same application diameter. Conforming to this embodiment, referring to an example of a line in which plural application nozzles S are set, when setting of a plurality is confirmed, the application program is simulated, and the total number of times of use necessary in the specific unit of the plural applicators having same application diameter is obtained from the information set in the program, and this total number of times of use is divided by the number of applicators having application nozzles of same application diameter, and this divided number of times of application is set as the continuous use count Sn in one applicator, and the flag S having plural applicators having same application diameter S is set to 1, thereby returning. If not plural, the count Sn is cleared, and the flag S is reset to 0. It is same for application diameter L and VS, and specific explanations are omitted.

FIG. 7 show sub-routine of R and L application operation process in FIG. 5, and a necessary application diameter is set on every occasion in the program, and it is processed according to the line of the set application diameter L, S or VS. Herein, supposing the application diameter S is set, the control of line of S is explained.

First it is judged if flag S is present. If flag S is 0, the corresponding application nozzle is not plural, and the application nozzle S is specified as usual, and application is done. When the flag S is 1 and there are plural corresponding application nozzles, the number of nozzles NS is judged. To identify the plural nozzles with predetermined addresses sequentially from the first, the address of "SN−(SN−1)" is specified, and a first application is done.

Every time the first application nozzle is used, the counters C, D are increased by +1, and the use of the first application nozzle is repeated until the count of counter A becomes equal to the preset continuous use count Sn. When becoming equal, the nozzle is specified by adding +1 to the application nozzle specified address, and the count of the counter C is cleared, and thereafter application is done similarly by the second application nozzle.

When the count of the counter D becomes equal to SN, it means plural application nozzles are all used, and the counter D is cleared and returned. As a result, the plural nozzles are used again from the first one. It is same for application nozzles of other application diameters, and specific explanations are omitted. Specific control is not limited to this operation alone, but it may be achieved by various programs.

Figure 8:
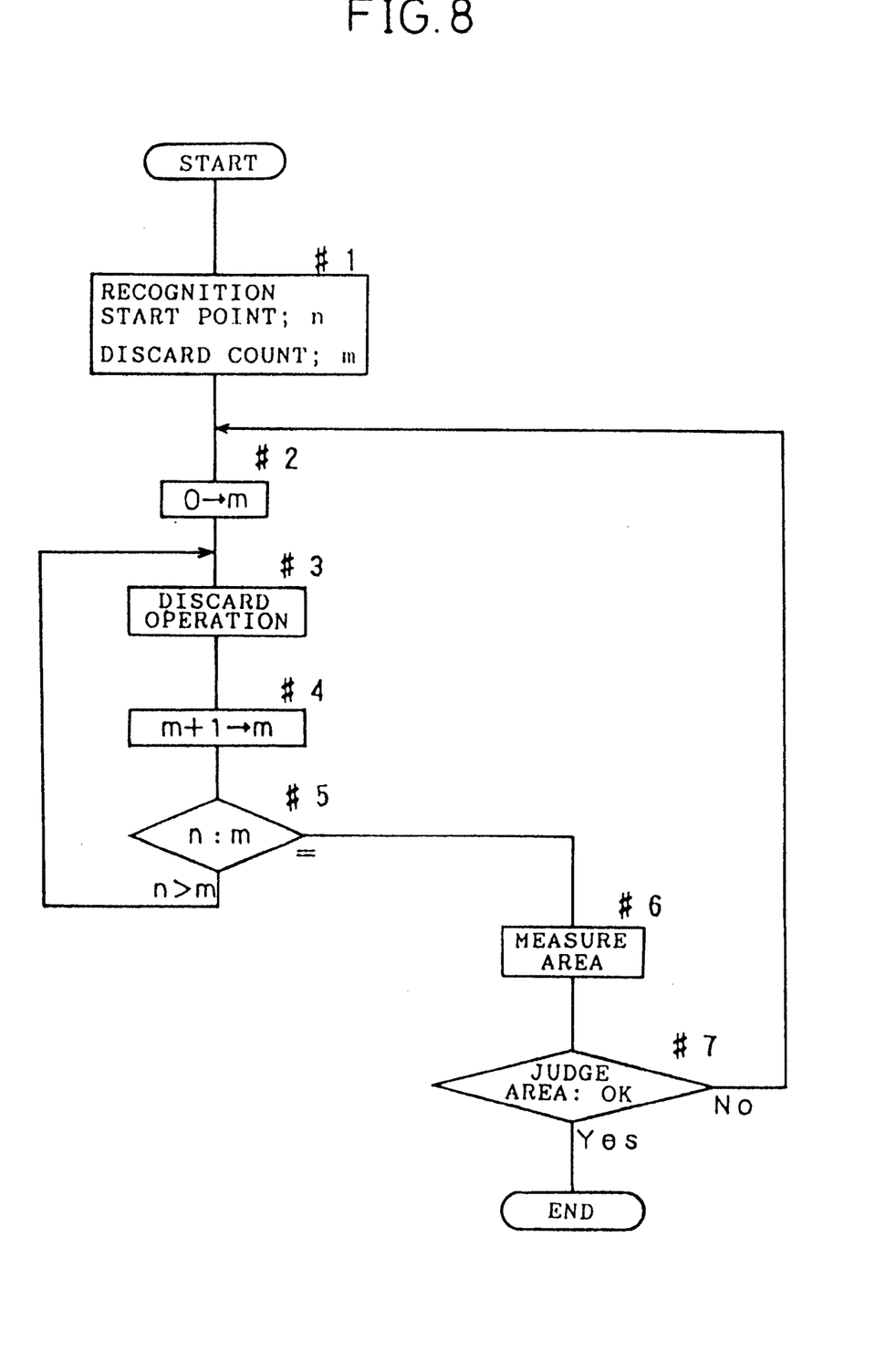
FIG. 8 is a flow chart necessary for adjusting the discharge amount of application nozzle according to trial application.
Figure 9:
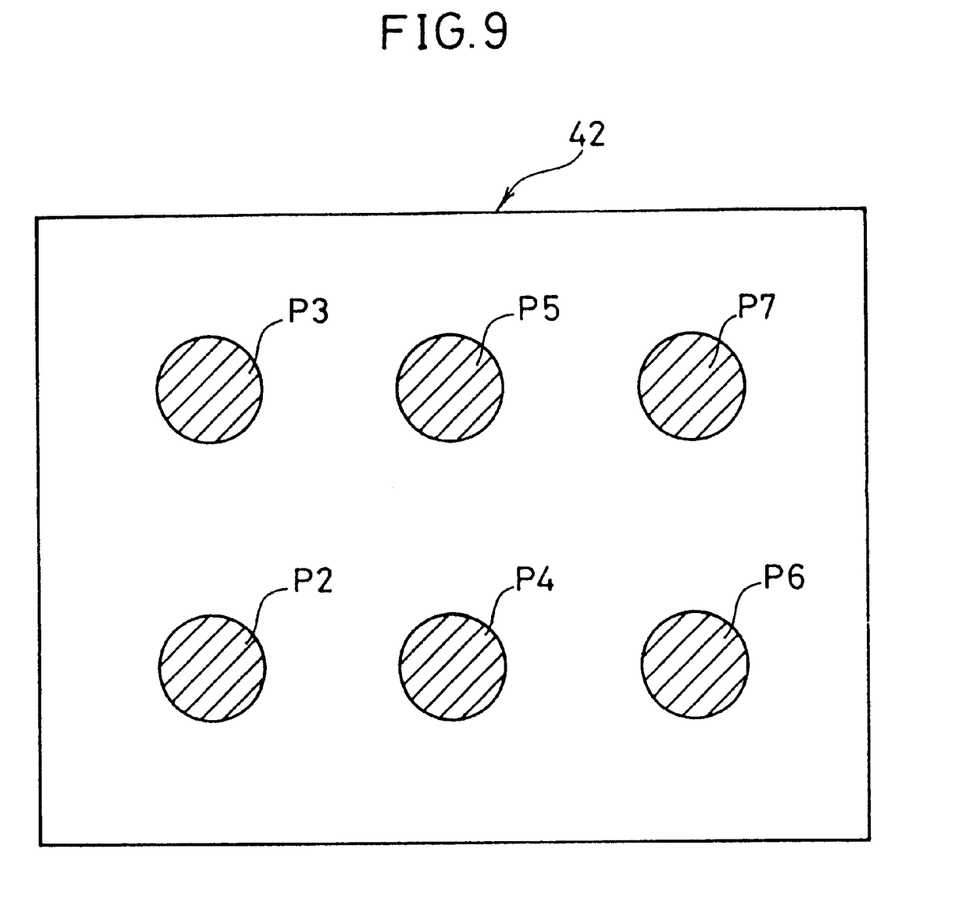
FIG. 9 is a plan view showing trial application position on a roll tape.

FIG. 8 and FIG. 9 show a practical example of control of trial application of application nozzle on the roll tape 42, and trial application is controlled by the microcomputer 28 to which the recognition camera 24 is connected.

At step #1 in the flowchart shown in FIG. 8, recognition start count n is set to determine to measure the application area by the recognition camera 24 about which time of trial application of the trial application done by the application nozzle on the roll tape 42, and the count m of the trial application times is set as a variable.

The recognition start count n means to recognize the application area of the n-th trial application, and n is set as follows. When the viscosity of the application material (adhesive) is low, the application diameter and application area of the trial application for applying at time intervals are same as the application diameter and application area in actual production for applying continuously in time, and hence n=1 is set. When the viscosity of the application material is high, the application diameter and application area of the trial application for applying at time intervals are not same as the application diameter and application area in actual production for applying continuously in time, but when trial applications are done continuously, the application diameter and application area of the trial application after a specific count depending on the viscosity of the application material are same as the application diameter and application area in actual production for applying continuously in time. Therefore, depending on the viscosity of the application material, the count of the trial application can be set to n so that the application diameter and application area of the trial application may be same as the application diameter and application area in actual production for applying continuously in time.

At step #2, the count m of the trial application count of the application material is initialized to 0. At step #3, the application nozzle starts trial application on the roll tape 42. At step #4, the trial application count is counted one by one.

At step #5, comparing the set value n and the trial application count m, if n>m, returning to step #3, trial application is continued until n=m. When n=m, the process advances to step #6.

At step #6, the recognition camera 24 recognizes the application area of the m-th trial application. At step #7, the recognition result of the application area of trial application recognized at step #6 is compared with the specified application area, and if the result of comparison is Yes, actual production is started, and if the result of comparison is No, going back to step #2, steps #2 to #7 are repeated.

FIG. 9 shows trial application positions P2 to P7 on the roll tape 42.

Explaining a case of recognition start count n=3, the first trial application is done on trial application positions P2 to P4, and the application area of the trial application of trial application position P4 is taken by the recognition camera 24. When the application area of the trial application of trial application position P4 is within an allowable range of specified application area, actual production is started.

If the application area of the trial application of trial application position P4 is out of an allowable range of specified application area, the discharge time of the application nozzle is varied on the basis of the result of comparison between the recognized application area and specified application area, and trial application is done on trial application positions P5 to P7, and the application area of trial application of trial application position P7 is taken by the recognition camera 24. When the application area of the trial application of trial application position P7 is within an allowable range of specified application area, actual production is started.

If the application area of the trial application of trial application position P7 is out of an allowable range of specified application area, the discharge time of the application nozzle is varied on the basis of the result of comparison between the recognized application area and specified application area, the roll tape 42 is fed, and trial application is done again on trial application positions P2 to p4, and the application area of trial application of trial application position P4 is taken by the recognition camera 24, and this operation is repeated until the application area of trial application of trial application position P4 or P7 settles within the allowable range of specified application area.

By constituting as explained in FIG. 8 and FIG. 9, regardless of properties such as viscosity of application material, the application diameter and application area of trial application to be recognized can be matched with the application diameter and application area in actual production, and fluctuations of application shape in actual work can be reduced, and hence it is effective to set the discharge of application nozzle promptly and efficiently.

In the foregoing embodiments, meanwhile, the roll tape 42 was used in trial application, and trial applications were made on this roll tape 42, but when trial applications are done on the circuit boards 1 to be coated actually, it is limited to use material having a sharp contrast with the adhesive.

What is claimed is:

1. A method for automatically applying adhesive to select application objects by plural applicators according to an operation program, comprising the steps of:
   using plural applicators having a same-size diameter,
   obtaining a total count of the uses about a proper number of application objects from a specific unit of information in the operation program about positions to be applied with the adhesive in the application objects,
   dividing the total count of said application objects to have an adhesive applied thereto by the number of said plural applicators having a corresponding same-size diameter, to obtain a ratio of use for each of said plural applicators, and
   sequentially changing plural applicators in use during an application of adhesive to said application object every time said ratio is reached.

2. A method for applying adhesive comprising the steps of:
   checking preliminarily that an application shape of every kind of adhesive to be applied by an applying apparatus is stabilized on and after an n-th time trial application specific to each adhesive, and registering the n-th time for each adhesive in a control unit, performing trial applications continuously with every kind of adhesive to be applied by the applying apparatus at the time of starting actual operation or changing the adhesive to be used, and confirming the application shape of the n-th time trial application with the adhesive by a recognition means, comparing a result of recognition by the recognition means with a shape of the n-th time trial application specified and registered in the control unit, and starting actual production when the result of recognition is approved as satisfactory.

* * * * *